US012811561B2

(12) United States Patent
Kuypers et al.

(10) Patent No.: US 12,811,561 B2
(45) Date of Patent: Nov. 24, 2026

(54) DUAL RESONATOR CHIP

(71) Applicant: KYOCERA TECHNOLOGIES OY, Espoo (FI)

(72) Inventors: Jan Kuypers, Espoo (FI); Antti Jaakkola, Espoo (FI)

(73) Assignee: KYOCERA Technologies Oy, Espoo (FI)

( * ) Notice: Subject to any disclaimer, the term of this patent is extended or adjusted under 35 U.S.C. 154(b) by 879 days.

(21) Appl. No.: 18/193,961

(22) Filed: Mar. 31, 2023

(65) Prior Publication Data

US 2024/0333248 A1 Oct. 3, 2024

(51) Int. Cl.

| | |
|---|---|
| *H03H 9/00* | (2006.01) |
| *H03H 9/02* | (2006.01) |
| *H03H 9/05* | (2006.01) |
| *H03H 9/46* | (2006.01) |
| *H10N 30/87* | (2023.01) |
| *H10N 97/00* | (2023.01) |

(52) U.S. Cl.

CPC ...... *H03H 9/0552* (2013.01); *H03H 9/02393* (2013.01); *H03H 9/462* (2013.01); *H10N 30/874* (2023.02); *H10N 97/00* (2023.02)

(58) Field of Classification Search

CPC .. H03H 9/0552; H03H 9/02393; H03H 9/462; H10N 30/874; H10N 97/00

See application file for complete search history.

(56) References Cited

U.S. PATENT DOCUMENTS

| | | | | |
|---|---|---|---|---|
| 5,844,452 | A * | 12/1998 | Yamamoto ......... | H03H 9/02157 310/368 |
| 7,639,094 | B1 * | 12/2009 | Stevenson ................ | H03B 5/36 331/162 |
| 8,698,376 | B2 | 4/2014 | Chen et al. | |
| 2006/0164186 | A1 * | 7/2006 | Stoemmer ............ | H03H 9/0542 333/191 |
| 2009/0265903 | A1 * | 10/2009 | Handtmann ............. | H03H 3/02 29/25.35 |

FOREIGN PATENT DOCUMENTS

JP 2015226189 A * 12/2015

* cited by examiner

*Primary Examiner* — Julio C. Gonzalez

(74) *Attorney, Agent, or Firm* — Espatent Oy

(57) ABSTRACT

A dual resonator chip, includes a kilohertz frequency resonator in the chip and a megahertz frequency resonator in the same chip, wherein the kilohertz frequency resonator and the megahertz frequency resonator are MEMS resonators.

12 Claims, 5 Drawing Sheets

DUAL RESONATOR CHIP

TECHNICAL FIELD

The present disclosure generally relates to the field of semiconductors and semiconductor chips. The disclosure relates particularly, though not exclusively, to a dual resonator chip.

BACKGROUND

This section illustrates useful background information without admission of any technique described herein representative of the state of the art.

There are several generations of communications networks. 4G is the fourth-generation communications network standard. 5G is the fifth-generation communications network standard that supersedes 4G. These are the newest global wireless standards after the older wireless standards 1G, 2G, and 3G. It is predicted that there will be new enhanced wireless communications standards in the future.

Long Term Evolution, LTE, is commonly mentioned in the context of 4G cellular access network communication, i.e. the fourth-generation global wireless communication standard. As an interim step up from 3G, 4G LTE provides more bandwidth than 3G, without achieving the full bandwidth of a 4G network.

The 5G global wireless communication standard is designed to connect virtually everyone and everything together including machines, objects, and devices.

Internet of Things, IoT, refers to a network of interconnected computing devices and objects capable of sharing data with other devices and systems over the internet. NB-IoT (also known as Cat-NB1) means a narrowband technology standard of IoT. NB-IoT is used in low throughput applications requiring low power and long-range, like smart metering, smart agriculture and smart city applications.

Modems are electronic devices that, inter alia, convert digital data signals into a format suitable for an analogue communication medium, such as for a telephone or a radio. Modems enable various network connections, such as cellular and other wireless connections. Examples of modems are a cellular LTE modem, a cellular 5G modem, an IoT LTE modem and a NB-IoT LTE modem. These modem systems typically need two frequencies, one for communication and another for a real-time clock for timing. The hardware for the said modem systems may typically comprise quartz crystal oscillators or similar.

There is an ongoing need to reduce the size of the hardware, which also means that there is an ongoing need to develop smaller systems.

Furthermore, there is an ongoing need to reduce the power consumption and extend battery-life in various applications, for instance due to environmental and practical reasons.

SUMMARY

The appended claims define the scope of protection. Any examples and technical descriptions of apparatuses, products and/or methods in the description and/or drawings not covered by the claims are presented not as embodiments of the invention but as background art or examples useful for understanding the invention.

It is an object of certain embodiments of the present disclosure to provide a smaller resonator solution, or at least to provide an alternative solution to existing technology.

Accordingly, certain disclosed embodiments provide for an ingenious chip having resonators in both kilohertz and megahertz frequency areas in one package.

According to a first example aspect of the present disclosure there is provided a dual resonator chip, comprising: a kilohertz frequency resonator in the chip, and a megahertz frequency resonator in the same chip, wherein the kilohertz frequency resonator and the megahertz frequency resonator are MEMS (microelectromechanical systems) resonators.

In certain alternative embodiments, though, the resonators need not be MEMS resonators. Accordingly, in an alternative first aspect there is provided a dual resonator chip, comprising: a kilohertz frequency resonator in the chip, and a megahertz frequency resonator in the same chip.

In certain embodiments, the kilohertz frequency resonator and the megahertz frequency resonator are attached to each other. In certain embodiments, the kilohertz frequency resonator and the megahertz frequency resonator are physically attached to each other.

In certain embodiments, the kilohertz frequency resonator and the megahertz frequency resonator are positioned on top of each other. In certain embodiments, the kilohertz frequency resonator and the megahertz frequency resonator are positioned directly on top of each other. In certain embodiments, the kilohertz frequency resonator and the megahertz frequency resonator are aligned on top of each other. In certain embodiments, the kilohertz frequency resonator and the megahertz frequency resonator are in a pile. In certain embodiments, the kilohertz frequency resonator and the megahertz frequency resonator are physically on top of each other such that the shadow of the kilohertz frequency resonator is directly on top of the megahertz frequency resonator.

In certain alternative embodiments, the kilohertz frequency resonator and the megahertz frequency resonator are positioned side by side. In certain alternative embodiments, the kilohertz frequency resonator and the megahertz frequency resonator are positioned side by side in the same chip.

In certain embodiments, the chip comprises a top wafer portion and a bottom wafer portion bonded together to form the chip. In certain embodiments, the bottom wafer portion is a whole wafer. In certain embodiments, the bottom wafer portion is a part of a wafer. In certain embodiments, the top wafer portion is a whole wafer. In certain embodiments, the top wafer portion is a part of a wafer.

In certain embodiments, a single dual resonator chip comprises both the megahertz frequency and the kilohertz frequency resonators. In certain embodiments, the bottom wafer portion comprises the megahertz frequency resonator. In certain embodiments, the top wafer portion comprises the kilohertz frequency resonator. In certain embodiments, the megahertz frequency resonator is in the bottom wafer portion. In certain embodiments, the kilohertz frequency resonator is in the top wafer portion.

In certain embodiments, the bottom wafer portion comprises the megahertz frequency resonator and the kilohertz frequency resonator. In certain alternative embodiments, the megahertz frequency resonator and the kilohertz frequency resonator are both in the bottom wafer portion.

In certain embodiments, the megahertz frequency resonator is fabricated on a substrate. In certain embodiments, the kilohertz frequency resonator is fabricated on a substrate. In certain embodiments, the substrate is a wafer. In certain embodiments, the substrate is a silicon wafer. In certain embodiments, the substrate comprises a silicon body.

In certain embodiments, the megahertz frequency resonator and the kilohertz frequency resonator are integrated into one package. In certain embodiments, the megahertz frequency resonator and the kilohertz frequency resonator are integrated into one package on top of each other. In certain embodiments, the megahertz frequency resonator and the kilohertz frequency resonator are integrated into one package on top of each other by bonding (by bonding the said wafer portions comprising the said resonators).

In certain alternative embodiments, the megahertz frequency resonator and the kilohertz frequency resonator are integrated into one package side by side.

In certain embodiments, the top wafer portion and the bottom wafer portion are bonded together to form a chip. In certain embodiments, the megahertz frequency resonator and the kilohertz frequency resonator (the wafer portions comprising the resonators) are bonded together to form a chip. In certain embodiments, the bonding comprises thermocompression bonding. In certain embodiments, the bonding comprises eutectic bonding, or flip chip bonding. In certain alternative embodiments, the bonding comprises glass frit bonding, anodic bonding, or adhesive bonding. In certain embodiments, the bonding of the wafer portions comprising the megahertz frequency resonator and the kilohertz frequency resonator forms an encapsule.

In certain embodiments, to improve signal transfer from the kilohertz frequency resonator or megahertz frequency resonator to the other side, other bonding methods may be applied. In certain embodiments, the bonding comprises wire bonding, mechanical contacts formed during bonding, or contacts formed after bonding.

In certain embodiments, the kilohertz frequency resonator and the megahertz frequency resonator are attached to each other such that resonating bodies reside inside the said encapsule. In certain embodiments, the kilohertz frequency resonator and the megahertz frequency resonator are attached to each other in a face-to-face configuration (on top of each other).

In certain embodiments, the megahertz resonator is adapted to operate in a megahertz frequency area, MHz (frequency range). In certain embodiments, the kilohertz resonator is adapted to operate in a kilohertz frequency area, kHz (frequency range).

In certain embodiments, the megahertz frequency resonator is a megahertz frequency resonator having a 13 MHz resonance frequency. In certain embodiments, the megahertz frequency resonator is a megahertz frequency resonator having a 19.2 MHz resonance frequency. In certain embodiments, the megahertz frequency resonator is a megahertz frequency resonator having a 26 MHz resonance frequency. In certain embodiments, the megahertz frequency resonator is a megahertz frequency resonator having a 38.4 MHz resonance frequency. In certain embodiments, the megahertz frequency resonator is a megahertz frequency resonator having a 52 MHZ resonance frequency. In certain embodiments, the megahertz frequency resonator is a megahertz frequency resonator having a 76.8 MHz resonance frequency.

In certain embodiments, the kilohertz frequency resonator is a kilohertz frequency resonator having a 32.768 kHz resonance frequency. In certain embodiments, the kilohertz frequency resonator is a kilohertz frequency resonator having a 65.536 kHz resonance frequency.

In certain embodiments, the kilohertz frequency resonator is adapted to resonate in an out of plane resonance mode. In certain embodiments, the kilohertz frequency resonator is adapted to resonate in a flexural resonance mode. In certain embodiments, the kilohertz frequency resonator is adapted to resonate in an out of plane flexural resonance mode. In certain embodiments, the kilohertz frequency resonator is adapted to resonate in an in-plane flexural resonance mode. In certain embodiments, the kilohertz frequency resonator is a piezoelectric resonator. In certain embodiments, the kilohertz frequency resonator is a cantilever resonator. In certain embodiments, the kilohertz frequency resonator is a tuning fork resonator. In certain embodiments, the kilohertz frequency resonator enables a timing solution in the chip, such as a real-time timing solution in the chip. In certain embodiments, the kilohertz frequency resonator enables a real-time clock in the chip.

In certain embodiments, the kilohertz frequency resonator is a MEMS, microelectromechanical systems, resonator.

In certain alternative embodiments, the kilohertz frequency resonator is a crystal resonator (oscillator). In certain alternative embodiments, the kilohertz frequency resonator comprises a quartz crystal resonator. In certain alternative embodiments, the quartz crystal resonator comprises a X-cut quartz crystal resonator, XY-cut quartz crystal resonator or NT-cut quartz crystal resonator.

In certain embodiments, the megahertz frequency resonator is adapted to resonate in an in-plane resonance mode. In certain embodiments, the megahertz frequency resonator is adapted to resonate in a length extensional resonance mode. In certain embodiments, the megahertz frequency resonator is adapted to resonate in an in-plane length extensional resonance mode. In certain embodiments, the megahertz frequency resonator is adapted to resonate in a Lamb wave resonance mode. In certain embodiments, the megahertz frequency resonator is adapted to resonate in a contour resonance mode. In certain embodiments, the megahertz frequency resonator is a beam resonator. In certain embodiments, the megahertz frequency resonator is a stacked beam resonator. In certain embodiments, the megahertz frequency resonator provides a wireless communication solution reference frequency for the chip. In certain embodiments, the megahertz frequency resonator provides a frequency reference for communication.

In certain embodiments, the megahertz frequency resonator is a MEMS, microelectromechanical systems, resonator.

In certain alternative embodiments, the megahertz frequency resonator is a crystal resonator (oscillator). In certain alternative embodiments, the megahertz frequency resonator comprises a quartz crystal resonator. In certain alternative embodiments, the quartz crystal resonator comprises an AT-cut quartz crystal resonator.

In certain embodiments, the megahertz frequency resonator is adapted to resonate in an in-plane resonance mode and the kilohertz frequency resonator is adapted to resonate in an out of plane resonance mode. In certain embodiments, the megahertz frequency resonator is adapted to resonate in an in-plane length extensional resonance mode and the kilohertz frequency resonator is adapted to resonate in an out of plane flexural resonance mode. In certain embodiments, the kilohertz frequency resonator and the megahertz frequency resonator are MEMS resonators.

In certain embodiments, the megahertz frequency resonator and the kilohertz frequency resonator are integrated into one package. In certain embodiments, the kilohertz frequency resonator and the megahertz frequency resonator are electrically isolated from each other. In certain embodiments, the megahertz frequency resonator and the kilohertz frequency resonator each have their own individual contact pads (separate from the contact pads of the other resonator).

In certain embodiments, the megahertz frequency resonator and the kilohertz frequency resonator each have their own contact pads. In certain embodiments, the megahertz frequency resonator and the kilohertz frequency resonator are integrated into one package, each comprising their own separate contact pads.

In certain embodiments, the contact pads are adapted to provide individual electrical connections (electrical current, electrical signal) to the kilohertz frequency resonator and to the megahertz frequency resonator. In certain embodiments, the contact pads are adapted to provide electrical connection to through silicon vias. In certain embodiments, wirings of the chip are attached to the contact pads.

In certain embodiments, the dual resonator chip comprises a gap in between the top wafer portion and the bottom wafer portion when the top wafer portion and the bottom wafer portion are bonded together. In certain embodiments, the dual resonator chip comprises respective cavities in which the megahertz frequency resonator and the kilohertz frequency resonator resonate. In certain embodiments, the bottom wafer portion comprises a first cavity for the megahertz frequency resonator to resonate in. In certain embodiments, the top wafer portion comprises a second cavity for the kilohertz frequency resonator to resonate in.

In certain embodiments, the dual resonator chip comprises through silicon vias, TSVs, in the top wafer portion. In certain embodiments, the vias are adapted to provide electrical connection through the silicon body of the top wafer portion. In certain embodiments, the vias are adapted to provide electrical connection through the silicon body and the piezoelectric layer of the top wafer portion.

In certain embodiments, the vias are adapted to provide electrical connection through the top wafer portion. In certain embodiments, the vias are adapted to provide electrical connection through the top wafer portion to the bottom wafer portion. In certain embodiments, the vias are adapted to provide electrical connection through the top wafer portion to the megahertz frequency resonator (which resides on the bottom wafer portion). In certain embodiments, the vias are adapted to provide electrical connection to the kilohertz frequency resonator (which resides on the top wafer portion). In certain embodiments, the vias are adapted to provide electrical connection to both the megahertz frequency resonator and the kilohertz frequency resonator.

In certain embodiments, the dual resonator chip comprises through silicon vias, TSVs, adapted to provide electrical connection through the top wafer portion to both the megahertz frequency resonator and the kilohertz frequency resonator.

In certain embodiments, the through silicon vias comprise first vias and second vias. In certain embodiments, the first vias are adapted to provide electrical connection through the top wafer portion to the megahertz frequency resonator. In certain embodiments, the second vias are adapted to provide electrical connection through the top wafer portion to the kilohertz frequency resonator. In certain embodiments, the contact pads of the megahertz frequency resonator are adapted to provide electrical connection to the resonating body using first vias. In certain embodiments, the contact pads of the kilohertz frequency resonator are adapted to provide electrical connection to the resonating body using second vias.

In certain embodiments, the dual resonator chip supports wafer level packaging, WLP. In certain embodiments, the dual resonator chip is mounted to a laminate with reflow soldering. In certain embodiments, the laminate comprises FR4 or ceramic. In certain embodiments, the dual resonator chip is bumped and reflow soldered. In certain embodiments, the dual resonator chip is flip chip mounted. In certain embodiments, the dual resonator chip is attached with adhesive, and wire bonded. In certain alternative embodiments, a die attach film, DAF, is used for attaching the dual resonator chip and wire bonding is used for the electrical connections.

Different non-binding example aspects and embodiments have been illustrated in the foregoing. The embodiments in the foregoing are used merely to explain selected aspects or steps that may be utilized in different implementations. Some embodiments may be presented only with reference to certain example aspects. It should be appreciated that corresponding embodiments may apply to other example aspects as well. In particular, the embodiments described in the context of the first aspect are applicable to each further aspect. Any appropriate combinations of the embodiments may be formed.

BRIEF DESCRIPTION OF THE FIGURES

Some example embodiments will be described with reference to the accompanying figures, in which.

DETAILED DESCRIPTION

In the following description, like reference signs denote like elements or steps.

As used herein, the term chip means a single package, i.e. one physical entity that comprises resonating structure(s). According to certain embodiments of the instant solution, the chip comprises two resonators. According to certain embodiments of the instant solution, the chip comprises a megahertz frequency resonator and a kilohertz frequency resonator.

As used herein, the term die means the part that is diced from a ready fabricated silicon wafer in the dicing operation. In dicing, the dies are separated from each other using a special equipment. In the context of the instant disclosure, the term die forms a synonym to the term chip. Other synonyms to the terms chip and die is the term component.

As used herein, the term circuit board means a board that may comprise multiple chips. The chips are attached to the board to form a circuit board. The circuit board is then attached to the electrical equipment. The chips on the circuit board may be for various purposes. A modem circuit board is an example of a circuit board, in which the chip can be attached to.

Figure 1A:
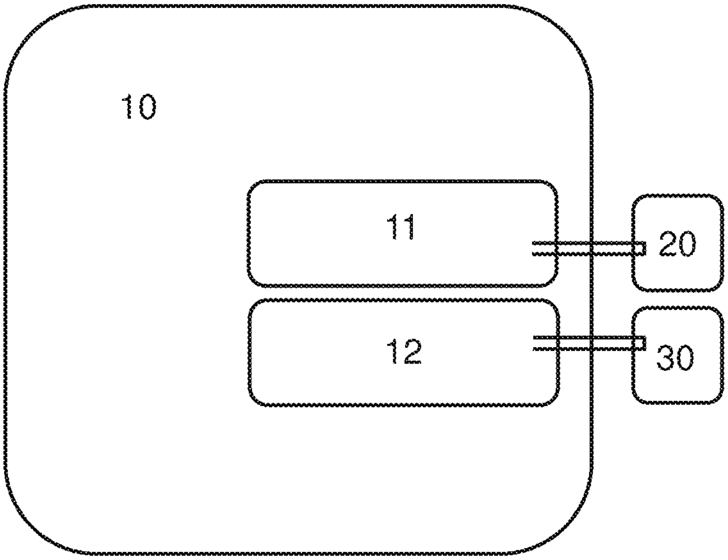
Fig. 1a PRIOR ART
FIG. 1*a* schematically shows a prior art circuit board.

FIG. 1*a* shows a prior art circuit board. A kilohertz oscillator 11 is attached to the circuit board 10 to provide a real time clock. A megahertz oscillator 12 is attached to the circuit board 10 to provide a frequency reference for communication. The kilohertz oscillator 11 and the megahertz oscillator 12 are electrically connected to external components (chips) 20 and 30. The external component 20 is a resonator operating in kilohertz frequency area. The external component 30 is a resonator operating in a megahertz frequency area.

The external component 20 is electrically connected via wirings to the kilohertz oscillator 11. The external component 30 is electrically connected via wirings to the megahertz oscillator 12. The external components 20 and 30 may be crystal components, such as quartz crystal resonators.

As shown in FIG. 1*a*, the prior art circuit board requires two separate chips comprising one resonator each, for the kilohertz frequency area and for the megahertz frequency area. Two different frequency areas are typically utilized in circuit boards for modem purposes.

Figure 1B:
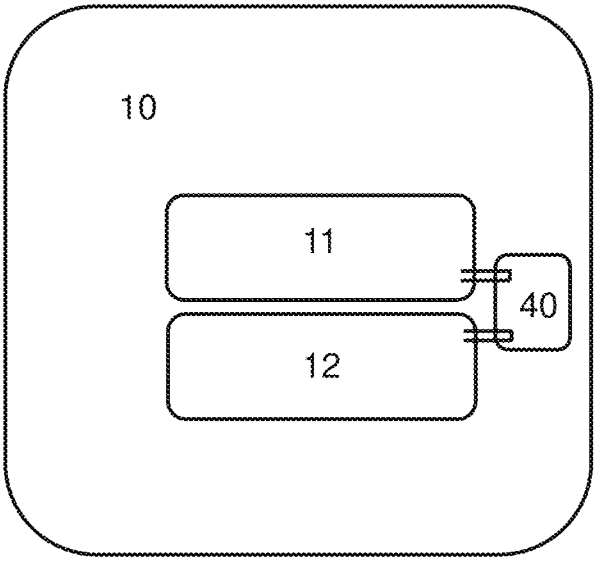
FIG. 1*b* schematically shows a circuit board comprising a chip according to an example embodiment.

FIG. 1*b* shows a circuit board comprising an ingenious chip. The circuit board 10 may be a modem, such as an Internet of Things, IoT, LTE modem or a narrowband Internet of Things, NB-IoT, LTE modem. The kilohertz oscillator 11 and the megahertz oscillator 12 are attached to the circuit board 10. The kilohertz oscillator 11 and the megahertz oscillator 12 are electrically connected to a single chip 40. The chip 40 is a dual resonator chip, comprising a kilohertz, kHz, frequency resonator in the chip, and a megahertz, MHZ, frequency resonator in the same chip. According to certain embodiments, the kilohertz frequency resonator and the megahertz frequency resonator are on top of each other to form the chip 40.

The dual resonator chip 40 is electrically connected via wirings to the kilohertz oscillator 11 and to the megahertz oscillator 12. Individual wirings are provided from the dual resonator chip 40 to each of the kilohertz oscillator 11 and the megahertz oscillator 12. According to certain embodiments, the dual resonator chip 40 comprises microelectromechanical, MEMS, resonators.

The megahertz frequency resonator means that the resonator is adapted to operate in a megahertz frequency area (frequency range). The kilohertz frequency resonator means that the resonator is adapted to operate in a kilohertz frequency area (frequency range).

As shown in FIG. 1*b*, the dual resonator chip 40 enables integrating two different frequency area resonators into one package without doubling the size (or footprint). When the two different frequency area resonators are implemented in a single chip, instead of implementing two separate components for different frequency area resonators, less space is needed for providing the same functionalities.

Figure 2A:
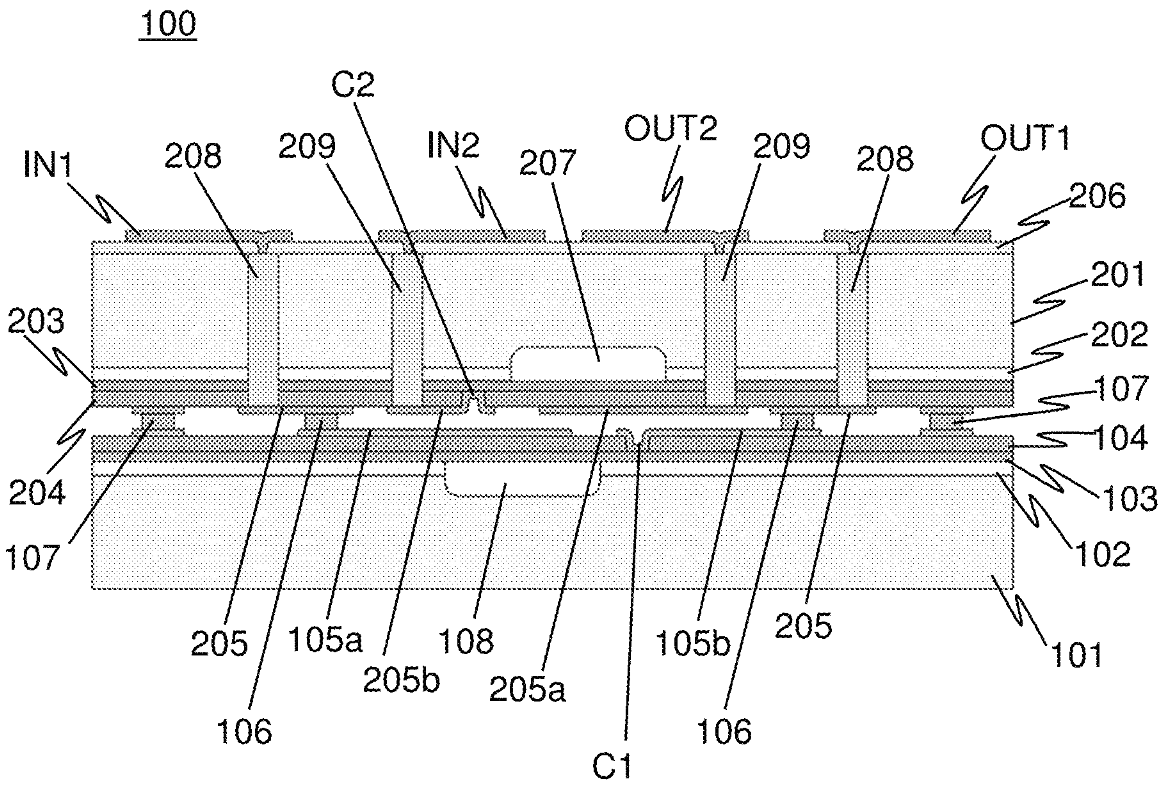
FIG. 2*a* schematically shows a chip according to an example embodiment.

FIG. 2*a* shows a chip 100 according to certain embodiments. The chip 100 comprises a top wafer portion 201 and a bottom wafer portion 101. Preferably, the top wafer portion 201 and the bottom wafer portion 101 are of silicon. The top wafer portion 201 and the bottom wafer portion 101 are bonded together to form the chip 100. According to certain embodiments, the bonding used is a thermocompression bonding. In certain embodiments, the bonding comprises eutectic bonding, or flip-chip bonding. In certain alternative embodiments, the bonding comprises glass frit bonding, anodic bonding, or adhesive bonding. In certain embodiments, the bonding occurs in a vacuum.

In certain embodiments, to improve signal transfer from the kilohertz frequency resonator or megahertz frequency resonator to the other side, other bonding methods may be applied.

In certain embodiments, the bonding comprises wire bonding, mechanical contacts formed during bonding, or contacts formed after bonding.

In certain embodiments, the megahertz frequency resonator is fabricated in the bottom wafer portion 101. In certain preferred embodiment, the megahertz frequency resonator is fabricated in the bottom wafer portion 101 prior to bonding. In certain embodiments, the bottom wafer portion 101 comprises an insulating layer 102 on top of the bottom silicon wafer portion 101. In certain embodiments, the insulating layer 102 is of silicon dioxide, $SiO_2$. In certain embodiments, the bottom wafer portion 101 comprises a conducting layer 103 on top of the insulating layer 102. In certain embodiments, the conducting layer 103 is of conducting material, such as W, Si or Mo. In alternative embodiments, the conducting layer 103 is of highly doped silicon (such as highly doped single-crystalline silicon). Highly doped in the context may refer to an average doping concentration of at least $2\times10^{19}$ $cm^{-3}$, or at least $1\times10^{20}$ $cm^{-3}$ in certain embodiments. The conducting layer 103 forms a bottom electrode for the megahertz frequency resonator.

In certain embodiments, the bottom wafer portion 101 comprises a piezoelectric layer 104 on top of the conducting layer 103. In certain embodiments, the piezoelectric layer 104 is of aluminum nitride, AlN. In certain embodiments, the bottom wafer portion 101 comprises conductive pads 105*a* and 105*b* on top of the piezoelectric layer 104. The conductive pads 105*a* and 105*b* are formed by patterning a conductive layer. According to certain embodiments, the conductive pads 105*a* and 105*b* are of gold, Au. The conductive pads 105*a* and 105*b* form the top electrode for the megahertz frequency resonator. In certain embodiments, a contact point C1 is provided for the conductive pad 105*b* through the piezoelectric layer 104 to the conducting layer 103, to the bottom electrode of the megahertz frequency resonator.

In certain embodiments, the chip 100 comprises bonding areas 106 and 107. The bonding areas provide contact between the top wafer portion 201 and the bottom wafer portion 101 upon bonding to form the chip 100. In certain embodiments, the bonding areas 106 and 107 are fabricated on the bottom wafer portion 101. In certain alternative embodiments, the bonding areas are fabricated on the top wafer portion 201. In certain yet alternative embodiments, the bonding areas 106 and 107 are fabricated to both the bottom wafer portion 101 and the top wafer portion 201.

The bonding areas 106 reside on top of the conductive pads 105*a* and 105*b*. The bonding areas 106 provide electrical contact to the conductive pads 105*a* and 105*b*. From the conductive pads 105*a* and 105*b*, the electrical connection extends to the megahertz frequency resonator.

The bonding areas 107 provide physical contact for the chip 100 to stay intact. In certain embodiments, the bonding areas 107 circulate around the chip 100, forming a continuous bonding circle. In certain embodiments, the continuous bonding circle provides a hermetic sealing of the chip.

The bottom wafer portion 101 comprises a first cavity 108. The megahertz frequency resonator resides at the cavity 108. The cavity 108 separates the megahertz frequency resonator from the bottom wafer portion 101.

In certain embodiments, the kilohertz frequency resonator is fabricated in the top wafer portion 201. In certain preferred embodiment, the kilohertz frequency resonator is fabricated in the top wafer portion 201 prior to bonding. First, the kilohertz frequency resonator is fabricated in the top wafer portion 201, after which the top wafer is flipped and bonded with the bottom wafer portion 101 to form a chip 100. In certain preferred embodiment, the megahertz frequency resonator is also fabricated in the bottom wafer portion 101 prior to bonding. The dual resonator chip 100 comprises a gap in between the top wafer portion 201 and the bottom wafer portion 101 when the top wafer portion 201 and the bottom wafer portion 101 are bonded together to form a chip 100.

In certain embodiments, the top wafer portion 201 is smaller than the bottom wafer portion 101. The smaller bottom wafer portion 101 size originates from wafer bonding and using blind-dicing to cut away portions of the top wafer portion 201. This exposes bonding areas 106, 107 on the bottom wafer portion 101 that can be used for wire bonding. The bonding areas 106, 107 form connections to both the megahertz frequency resonator and kilohertz frequency resonator. In certain embodiments, wire bonding is performed to the bottom wafer portion 201.

The following describes the kilohertz frequency resonator side of the top wafer portion 201, which is in the FIG. 2*a* facing downwards, towards the bottom wafer portion 101. In certain embodiments, the top wafer portion 201 comprises an insulating layer 202 on top of the silicon wafer portion 201. In certain embodiments, the insulating layer 202 is of silicon dioxide, $SiO_2$. A conducting layer 203 resides on top of the insulating layer 202. In certain embodiments, the conducting layer 203 is of conducting material, such as W, Si or Mo. In certain preferred embodiments, the conducting layer 203 is of highly doped silicon (such as highly doped single-crystalline silicon). Highly doped in the context may refer to an average doping concentration of at least $2\times10^{19}$ $cm^{-3}$, or at least $1\times10^{20}$ $cm^{-3}$ in certain embodiments. The conducting layer 203 forms a bottom electrode for the kilohertz frequency resonator.

In certain embodiments, the top wafer portion 201 comprises a piezoelectric layer 204 on top of the conducting layer 203. In certain embodiments, the piezoelectric layer 204 is of aluminum nitride, AlN. In certain embodiments, the top wafer portion 201 comprises conductive pads 205*a* and 205*b* on top of the piezoelectric layer 204. The conductive pads 205*a* and 205*b* are formed by patterning a conductive layer. According to certain embodiments, the conductive pads 205*a* and 205*b* are of gold, Au. The conductive pads 205*a* and 205*b* form the top electrode for the kilohertz frequency resonator. In certain embodiments, a contact point C2 is provided for the conductive pad 205*b* through the piezoelectric layer 204 to the conducting layer 203, to the bottom electrode of the kilohertz frequency resonator.

In certain embodiments, the top wafer portion 201 comprises a second cavity 207. The kilohertz frequency resonator resides at the cavity 207. The cavity 207 separates the kilohertz frequency resonator from the top wafer portion 201.

The chip 100 comprises through silicon vias, TSVs, 208 and 209. In certain embodiments, through silicon vias are formed through the top wafer portion 201. The vias 208 and 209 are adapted to provide electrical connection through the silicon wafer portion 201 and the piezoelectric layer 204 of the top wafer portion 201 to the resonators. According to certain embodiments, the vias 208 and 209 comprise conductive material, such as copper, Cu, or gold, Au. In certain embodiments, the copper, Cu comprises electroplated copper. In certain embodiments, the gold comprises electroplated gold. According to certain preferred embodiments, the vias 208 and 209 comprise highly doped polysilicon.

The vias comprise first vias 208 and second vias 209.

The first vias 208 are adapted to provide electrical connection through the top wafer portion 201 to the bottom wafer portion 101 and to the megahertz frequency resonator. The electrical connection is provided through the first vias 208, and then using the conductive pads 105*a* and 105*b* to the electrodes of the megahertz frequency resonator.

The second vias 209 are adapted to provide electrical connection through the top wafer portion 201 to the kilohertz frequency resonator. The electrical connection is provided through the second vias 209, and then using the conductive pads 205*a* and 205*b* to the electrodes of the kilohertz frequency resonator.

In certain embodiments, the through silicon vias 208 and 209 further comprise an electrical insulator layer (not shown), such as a dielectric liner. In certain embodiments, the through silicon vias 208 and 209 are encapsulated in an electrical insulator layer. In certain embodiments, the electrical insulator layer prevents the through silicon vias 208 and 209 from shorting with the bottom electrode 203 of the top wafer portion, and the silicon body of the top wafer portion 201.

The following describes the uppermost side of the chip 100, the opposite side of the top wafer portion 201 in comparison to the kilohertz frequency resonator side, which is in the FIG. 2*a* facing upwards. In certain embodiments, an isolating layer 206 is on an uppermost surface of the chip 100. According to certain embodiments, the isolating layer 206 is of silicon oxide, silicon nitride, or a combination thereof. In certain embodiments, the isolating layer 206 is of insulating polymer, such as polyimide. The isolating layer 206 is on the opposite side of the top wafer portion 201 in comparison to the kilohertz frequency resonator and the layers relating to its functionality (202, 203, 204, 205*a*, and 205*b*).

Figure 2B:
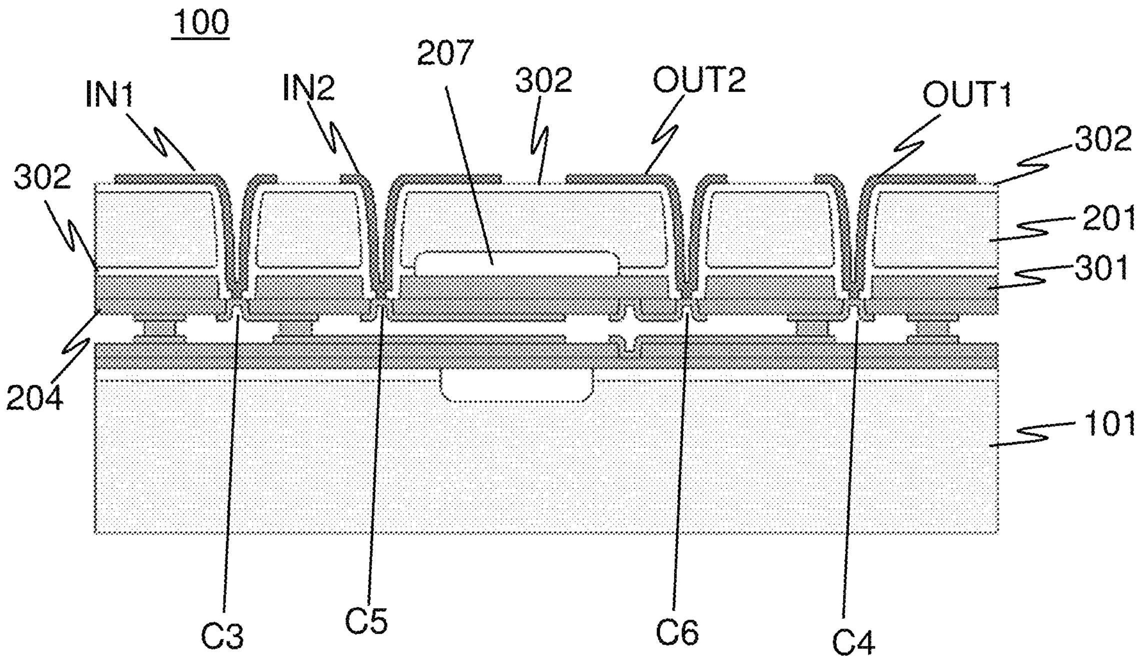
FIG. 2*b* schematically shows a chip according to another example embodiment.

In certain embodiments, the contact pads IN1, OUT1, IN2 and OUT2 are adapted to provide electrical connection to the vias 208 and 209. According to certain embodiments, the contact pads are of conductive material, such as gold, Au. According to certain embodiments, the contact pads are formed by patterning onto the chip. According to certain embodiments, the contact pads are adapted to extend to the vias (FIG. 2*b*).

The external wirings of the chip 100 are connected to the contact pads IN1, OUT1, IN2 and OUT2. The contact pads IN1 and IN2 are adapted to provide electrical connection into the chip 100. The contact pads OUT1 and OUT2 are adapted to provide electrical connection out of the chip 100.

The contact pads IN1 and OUT1 are adapted to provide electrical connection to the first vias 208. The electrical connection is provided eventually to the electrodes of the megahertz frequency resonator using the vias 208.

The contact pads IN2 and OUT2 are adapted to provide electrical connection to the second vias 209. The electrical connection is provided eventually to the electrodes of the kilohertz frequency resonator using the vias 209.

In an alternative embodiment shown in FIG. 2*b*, the chip 100 comprises a dielectric liner 302. The dielectric liner 302 is adapted to cover the top of the chip 100 and to extend to the via walls. The dielectric liner 302 is adapted to cover the walls of the vias. In certain embodiments, the dielectric liner 302 is adapted to cover the top wafer portion 201 from the side of the kilohertz frequency resonator and the cavity 207. According to this alternative embodiment, the chip 100 comprises a conducting layer 301. In certain embodiments, the conducting layer 301 is of conducting material, such as W, Si or Mo. In certain preferred embodiments, the conducting layer 203 is of highly doped silicon (such as highly doped single-crystalline silicon). Highly doped in the context may refer to an average doping concentration of at least $2\times10^{19}$ $cm^{-3}$, or at least $1\times10^{20}$ $cm^{-3}$ in certain embodiments. As shown in FIG. 2*b*, the dielectric liner 302 is in between the conducting layer 301 and the top wafer portion 201.

In this embodiment, the contact pads IN1, OUT1, IN2 and OUT2 are adapted to extend to the vias. The contact pads IN1, OUT1, IN2 and OUT2 are adapted to provide electrical connection to the kilohertz frequency resonator and to the megahertz frequency resonator. In certain embodiments, the dielectric layer 302 and the contact pads IN1, OUT1, IN2 and OUT2 both are adapted to extend through the layer 301. As discussed in context of FIG. 2*a*, the conductive pad of the kilohertz frequency resonator comprises contact point C2 through the piezoelectric layer 204. In this alternative embodiment, similar contact points C3, C4, C5 and C6 are adapted to provide electrical connection to the kilohertz frequency resonator and to the megahertz frequency resonator.

In certain embodiments, the contact points C3 and C4 are adapted to provide electrical connection to the megahertz frequency resonator. In certain embodiments, the contact points C5 and C6 are adapted to provide electrical connection to the kilohertz frequency resonator.

Figure 3:
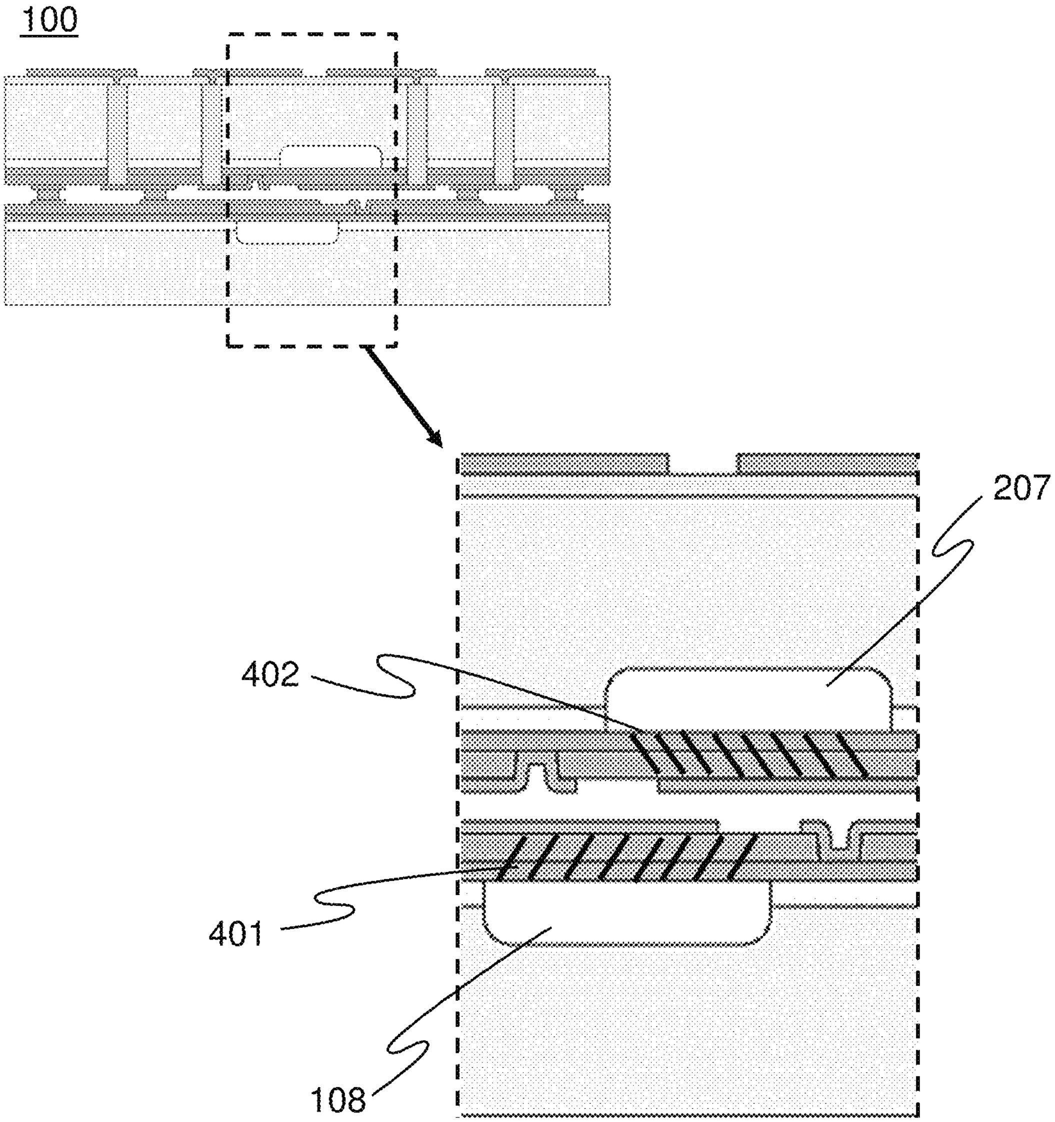
FIG. 3 schematically shows an enlarged portion of the chip according to an example embodiment of FIG. 2*a;*

FIG. 3 shows an enlarged portion of the chip 100 shown in FIG. 2*a*. The enlarged portion is focused on the area of the cavities 108 and 207. FIG. 3 illustrates the location of the resonators in the chip 100.

The slashed areas 401 and 402 marked to the enlarged portion denote the locations of the resonators in the chip 100. The slashed area 401 shows that the cavity 108 separates the megahertz frequency resonator from the bottom wafer portion 101. In certain embodiments, the cavity 108 is adapted to provide space for the resonating body of the megahertz frequency resonator to resonate in.

The slashed area 402 shows that the cavity 207 separates the megahertz frequency resonator from the top wafer portion 201 in certain embodiments. In certain embodiments, the cavity 207 is adapted to provide space for the resonating body of the kilohertz frequency resonator to resonate in.

Figure 4:
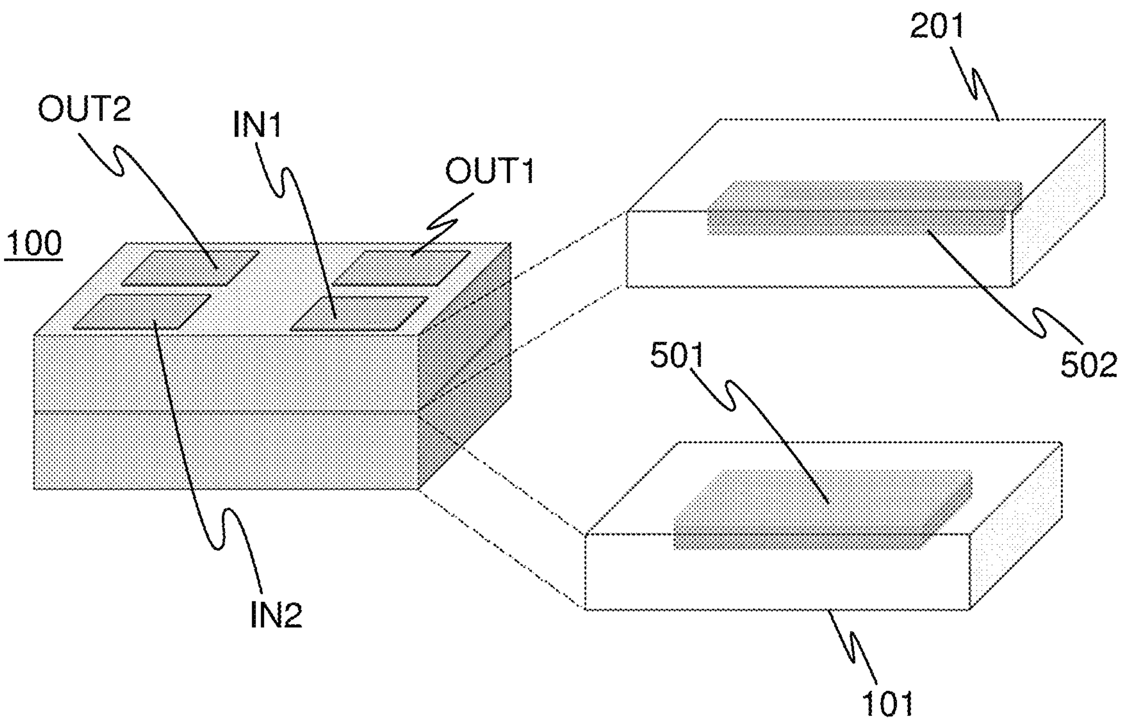
FIG. 4 schematically shows a 3D chip according to yet another example embodiment.

FIG. 4 schematically shows a 3D construction of the dual resonator chip 100. The chip 100 comprises a bottom wafer portion 101 and a top wafer portion 201. The bottom wafer portion 101 comprises a megahertz frequency resonator 501. In certain embodiments, the top wafer portion 201 comprises a kilohertz frequency resonator 502. In this example embodiments, the kilohertz frequency resonator 502 and the megahertz frequency resonator 501 are located on top of each other.

The megahertz frequency resonator 501 and the kilohertz frequency resonator 502 are integrated into one package 100 on top of each other by bonding, forming an encapsule. According to certain embodiments, the kilohertz frequency resonator 502 and the megahertz frequency resonator 501 are attached to each other in a face-to-face configuration. This means that the resonating bodies of the kilohertz frequency resonator 502 and the megahertz frequency resonator 501 reside inside the said encapsule.

The contact pads IN1 and OUT1 are adapted to provide electrical connection to the megahertz frequency resonator 501. The contact pads IN2 and OUT2 are adapted to provide electrical connection to the kilohertz frequency resonator 502.

As shown in FIG. 4 (shown also in FIGS. 2*a* and 2*b*), the megahertz frequency resonator 501 and the kilohertz frequency resonator 502 each have their own separate (individual) contact pads IN1, OUT1, IN2 and OUT2. According to an embodiment, the contact pads IN1, OUT1, IN2 and OUT2 reside on top of a single chip 100. The megahertz frequency resonator 501 and the kilohertz frequency resonator 502 are integrated into one package, each comprising their own separate contact pads IN1, OUT1, IN2 and OUT2.

In certain embodiments, other contact pad configurations are possible. In certain embodiments, one or more contact pads are implemented. In certain embodiments, five or six contact pads are implemented.

In certain embodiments, the megahertz frequency resonator 501 is a MEMS resonator. In certain embodiments, the megahertz frequency resonator 501 is a beam resonator, such as a stacked beam resonator. In certain embodiments, the stacked beam resonator comprises adjacent beam elements (adjacent sub-elements). In certain embodiments, the stacked beam resonator comprises a plurality of adjacent beam elements. In certain embodiments, the stacked beam resonator comprises adjacent beam elements each having a width and a length-to width aspect ratio of higher than 1. In certain embodiments, each of the adjacent beam elements is coupled to at least one other beam element by one or more connection element. In certain embodiments, the megahertz frequency resonator 501 is adapted to resonate in an in-plane resonance mode, such as an in-plane length extensional resonance mode.

In certain embodiments, the kilohertz frequency resonator 502 is a MEMS resonator. In certain embodiments, the kilohertz frequency resonator 502 is tuning fork resonator. In certain embodiments, the kilohertz frequency resonator 502 is adapted to resonate in an out of plane resonance mode, such as an out of plane flexural resonance mode.

Figure 5A:
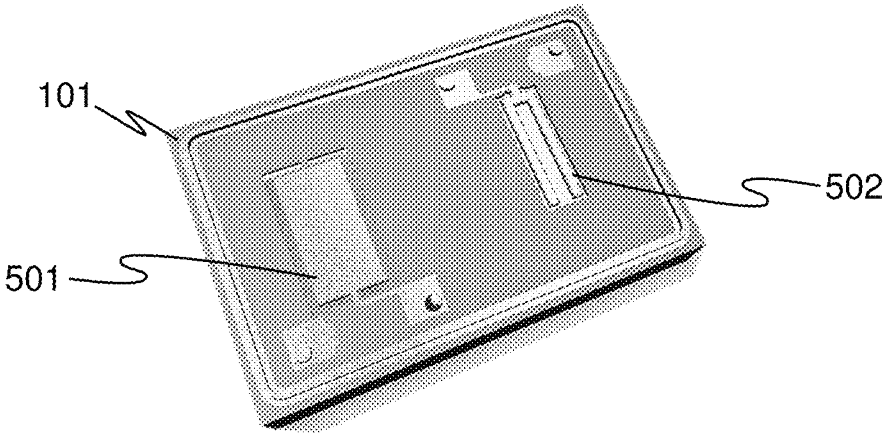
FIG. 5*a* schematically shows a 3D bottom wafer portion according to certain example embodiments.

FIG. 5*a* shows the 3D construction of an alternative embodiment of the bottom wafer portion 101 of the dual resonator chip 100. In this alternative embodiment, the megahertz frequency resonator 501 and the kilohertz frequency resonator 502 are integrated into one package side by side. In this alternative embodiment, the megahertz frequency resonator 501 and the kilohertz frequency resonator 502 are positioned side by side in the same chip 100.

Figure 5B:
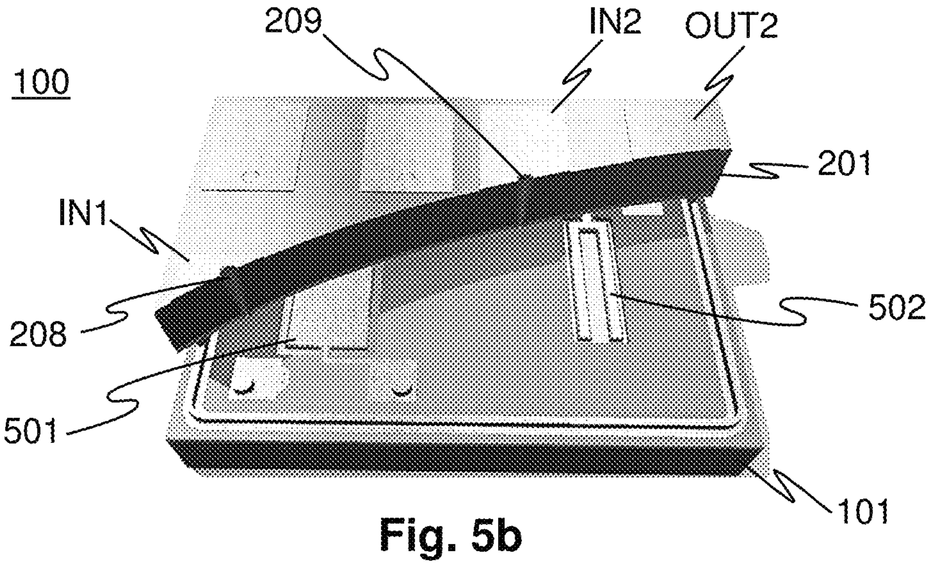
FIG. 5*b* schematically shows a partially opened 3D chip according to certain example embodiments.

FIG. 5*b* shows the 3D construction of an alternative embodiment of the dual resonator chip 100, more specifically a partially opened structure of the dual resonator chip 100. The dual resonator chip 100 comprises a top wafer portion 201 and a bottom wafer portion 101. The top wafer portion 201 and the bottom wafer portion 101 are bonded together to form the chip 100. According to certain alternative embodiments, the megahertz frequency resonator 501 and the kilohertz frequency resonator 502 are both in the bottom wafer portion 101.

The top wafer portion 201 comprises through silicon vias 208, 209. The vias 208, 209 are adapted to provide electrical connection through the silicon body of the top wafer portion 201 to both the megahertz frequency resonator 501 and the kilohertz frequency resonator 502.

In certain embodiments, the contact pads IN1, OUT1, IN2 and OUT2 are adapted to provide electrical connection to the vias 208 and 209. The contact pads IN1 and OUT1 (OUT1 not shown in FIG. 5*b*) are adapted to provide electrical connection to the first vias 208. The electrical connection is provided to the megahertz frequency resonator 501 using the first vias 208. The contact pads IN2 and OUT2 are adapted to provide electrical connection to the second vias 209. The electrical connection is provided to the kilohertz frequency resonator 502 using the second vias 209.

Figure 5C:
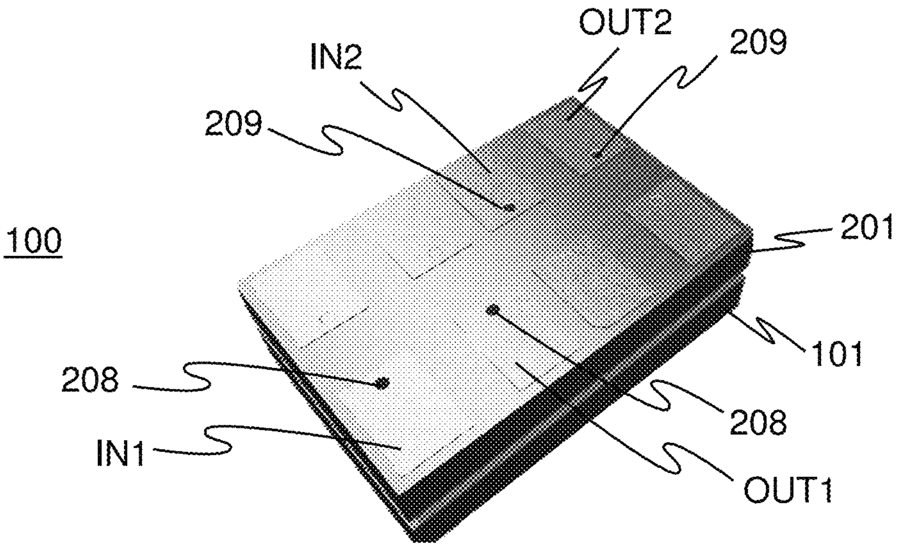
FIG. 5*c* schematically shows a 3D chip such as the 3D ship of FIG. 5*b* according to certain example embodiments.

FIG. 5*c* shows the 3D construction of the dual resonator chip 100, such as the chip 100 of FIG. 5*b*. The top wafer portion 201 and the bottom wafer portion 101 are bonded together to form an encapsule. In certain alternative embodiments, the bottom wafer portion comprises both the megahertz frequency resonator 501 and the kilohertz frequency resonator 502.

The megahertz frequency resonator 501 and the kilohertz frequency resonator 502 each have their own separate (individual) contact pads IN1, OUT1, IN2 and OUT2. In certain embodiments, the contact pads IN1, OUT1, IN2 and OUT2 reside on top of a chip 100. The contact pads IN1 and OUT1 are adapted to provide electrical connection to the megahertz frequency resonator 501. The contact pads IN2 and OUT2 are adapted to provide electrical connection to the kilohertz frequency resonator 502.

In certain embodiments, other contact pad configurations are possible. In certain embodiments, one or more contact pads are implemented. In certain embodiments, five or six contact pads are implemented.

Without limiting the scope and the interpretation of the patent claims, certain technical effects of one or more of the example embodiments disclosed herein are listed in the following. A technical effect of the invention is usage of two different frequency areas (frequency ranges) integrated into one chip. Therefore, there is no need to use two separate chips for different frequencies. A further technical effect is eliminating the need for a separate timing solution resonator for circuit boards. A further technical effect is providing a capability of a low-power real-time clock via the kilohertz frequency resonator. A further technical effect is providing a capability for a low phase-noise, high-quality carrier synthesis for wireless communication via the megahertz frequency resonator.

A further technical effect is s smaller chip size and less the space needed for the chip (whilst providing same functionalities as the prior art solution comprising more than one chip). A further technical effect is enabling a wafer-level packaging, WLP. A further technical effect is enabling easy integration of the chip to a circuit board, such as a modem. A further technical effect is eliminating the need for an additional housing or encapsulation for the chip.

A further technical effect is lower power consumption of the chip. The kilohertz frequency resonator having a 32.768 kHz resonance frequency enables a low power consumption, rendering the chip suitable for low power consumption applications, such as smart meters.

The 32.768 KHz frequency can be derived from e.g. a 32 MHz frequency or any other frequency with a phase-locked loop, PLL. However, the power consumption resulting from this would be too high for low power applications, such as for smart meters.

Various embodiments have been presented. It should be appreciated that in this document, words comprise, include, and contain are each used as open-ended expressions with no intended exclusivity.

The foregoing description has provided by way of non-limiting examples of particular implementations and embodiments a full and informative description of the best mode presently contemplated by the inventors for carrying out the invention. It is however clear to a person skilled in the art that the invention is not restricted to details of the embodiments presented in the foregoing, but that it can be implemented in other embodiments using equivalent means or in different combinations of embodiments without deviating from the characteristics of the invention.

Furthermore, some of the features of the afore-disclosed example embodiments may be used to advantage without the corresponding use of other features. As such, the foregoing description shall be considered as merely illustrative of the principles of the present invention, and not in limitation thereof. Hence, the scope of the invention is only restricted by the appended patent claims.

The invention claimed is:

1. A dual resonator chip, comprising:

a kilohertz frequency resonator in the chip; and a megahertz frequency resonator in the same chip, wherein the kilohertz frequency resonator and the megahertz frequency resonator are MEMS resonators.

2. The dual resonator chip of claim 1, wherein the kilohertz frequency resonator and the megahertz frequency resonator are attached to each other.

3. The dual resonator chip of claim 1, wherein the kilohertz frequency resonator and the megahertz frequency resonator are positioned on top of each other.

4. The dual resonator chip of claim 1, wherein the kilohertz frequency resonator and the megahertz frequency resonator are positioned side by side.

5. The dual resonator chip of claim 1, wherein the chip comprises a top wafer portion and a bottom wafer portion bonded together to form the chip.

6. The dual resonator chip of claim 1, wherein the bottom wafer portion comprises the megahertz frequency resonator.

7. The dual resonator chip of claim 1, wherein the top wafer portion comprises the kilohertz frequency resonator.

8. The dual resonator chip of claim 1, wherein the megahertz frequency resonator is configured to resonate in an in-plane length extensional resonance mode.

9. The dual resonator chip of claim 1, wherein the kilohertz frequency resonator is adapted to resonate in an out of plane resonance mode.

10. The dual resonator chip of claim 1, wherein the megahertz frequency resonator and the kilohertz frequency resonator are integrated into one package, each comprising their own individual contact pads.

11. The dual resonator chip of claim 1, wherein the kilohertz frequency resonator is a kilohertz frequency resonator having a 32.768 kHz resonance frequency.

12. The dual resonator chip of claim 1, comprising through silicon vias, TSVs, configured to provide electrical connection through the top wafer portion to both the megahertz frequency resonator and the kilohertz frequency resonator.

* * * * *